United States Patent
Landrum et al.

(10) Patent No.: US 6,185,092 B1
(45) Date of Patent: Feb. 6, 2001

(54) COMPUTER SYSTEM WITH IN-LINE SWITCHBOX MOUNTING

(75) Inventors: Gary Landrum, Montgomery; Michael Owens, Tomball, both of TX (US)

(73) Assignee: Compaq Computer Corporation

( * ) Notice: Under 35 U.S.C. 154(b), the term of this patent shall be extended for 0 days.

(21) Appl. No.: 09/390,233

(22) Filed: Sep. 3, 1999

(51) Int. Cl.[7] .................................. H05K 5/00; H05K 7/00
(52) U.S. Cl. .................... 361/683; 361/681; 361/686; 361/724; 361/727; 312/223.1; 312/223.2
(58) Field of Search ..................... 361/686, 683, 361/681, 724, 727; 312/223.1, 223.2; 364/705.01, 708.1

(56) References Cited

U.S. PATENT DOCUMENTS 5,388,032 * 2/1995 Gill et al. ............................ 364/146
5,801,921 * 9/1998 Miller ................................... 361/686
6,022,087 * 2/2000 Gibert .................................. 312/194

* cited by examiner

*Primary Examiner*—Leo P. Picard
*Assistant Examiner*—Tung Minh Bui
(74) *Attorney, Agent, or Firm*—Williams, Morgan & Amerson, P.C.

(57) ABSTRACT

An apparatus includes a cabinet, a keyboard assembly, and a switchbox. The cabinet has mounting rails. The keyboard assembly includes a keyboard tray and a keyboard slide. The keyboard slide has fixed and moveable portions. The fixed portion is mounted to the mounting rails, and the moveable portion is mounted to the keyboard tray. A switchbox is mounted to the fixed portion of the keyboard slide.

10 Claims, 6 Drawing Sheets

COMPUTER SYSTEM WITH IN-LINE SWITCHBOX MOUNTING

BACKGROUND OF THE INVENTION

1. Field of the Invention

This invention relates generally to mounting systems for computer systems, and, more particularly, to a computer system with an in-line switchbox mounting.

2. Description of the Related Art

Computer systems typically employ a monitoring system, such as a video display. Certain computer systems use a rack in which multiple devices, such as servers, peripheral devices, etc., are mounted. Often multiple servers are housed in the same rack, and are monitored by selectively coupling a video display, keyboard, and a mouse (or trackball) to one of the servers through a multiplexing unit. The multiplexing unit, commonly referred to as a switchbox, is typically installed in one of the slots in the rack.

One technique for providing the monitoring capability involves mounting a conventional monitor on a shelf in the rack unit. Such an arrangement uses a large amount of available rack space, and is thus inefficient if a large number of components are required to be mounted in the rack.

With the introduction of flat panel display technology, it is possible to reduce the depth required for a monitor. Currently, monitoring systems available for use in a rack system involve mounting a pivotable flat panel monitor and keyboard in a common tray (i.e., referred to as a monitoring tray) in the rack. One such arrangement is shown in U.S. Pat. No. 5,388,032. The monitor is pivotably mounted to the monitoring tray at its lower edge to allow the monitor to be raised for use while the monitoring tray is extended. When not in use the monitor is rotated to a horizontal position and the monitoring tray is inserted back into the rack. Such an arrangement has several disadvantages. First, because the monitor and keyboard are contained in a common tray, there is a practical limit on the number of positions in the rack that the monitoring tray can be located. Generally, the monitoring tray is mounted near waist level to allow a standing user to access the keyboard. Such a position has ergonomic disadvantages due to the proximity of the keyboard to the monitor, as the monitor may be difficult to view.

Another disadvantage of the common monitor and keyboard arrangement is that the monitoring tray must be essentially fully extended to allow access to the monitor. Some rack systems include doors that must also remain in an open position if the monitoring tray is to be left extended. In some cases, such as system installation, maintenance, or troubleshooting, it may be desirable to leave the monitor in a viewable position for an extended period of time. The extended position of the monitoring tray can be annoying to users that must maneuver around various racks with extended monitoring trays and/or doors. Open doors may also prevent effective monitoring of adjacent rack mounted equipment.

The present invention is directed to overcoming, or at least reducing the effects of, one or more of the problems set forth above.

SUMMARY OF THE INVENTION

An aspect of the present invention is seen in an apparatus including a cabinet, a keyboard assembly, and a switchbox. The cabinet has mounting rails. The keyboard assembly includes a keyboard tray and a keyboard slide. The keyboard slide has fixed and moveable portions. The fixed portion is mounted to the mounting rails, and the moveable portion is mounted to the keyboard tray. A switchbox is mounted to the fixed portion of the keyboard slide.

BRIEF DESCRIPTION OF THE DRAWINGS

The invention may be understood by reference to the following description taken in conjunction with the accompanying drawings, in which like reference numerals identify like elements, and in which.

Figure 1:
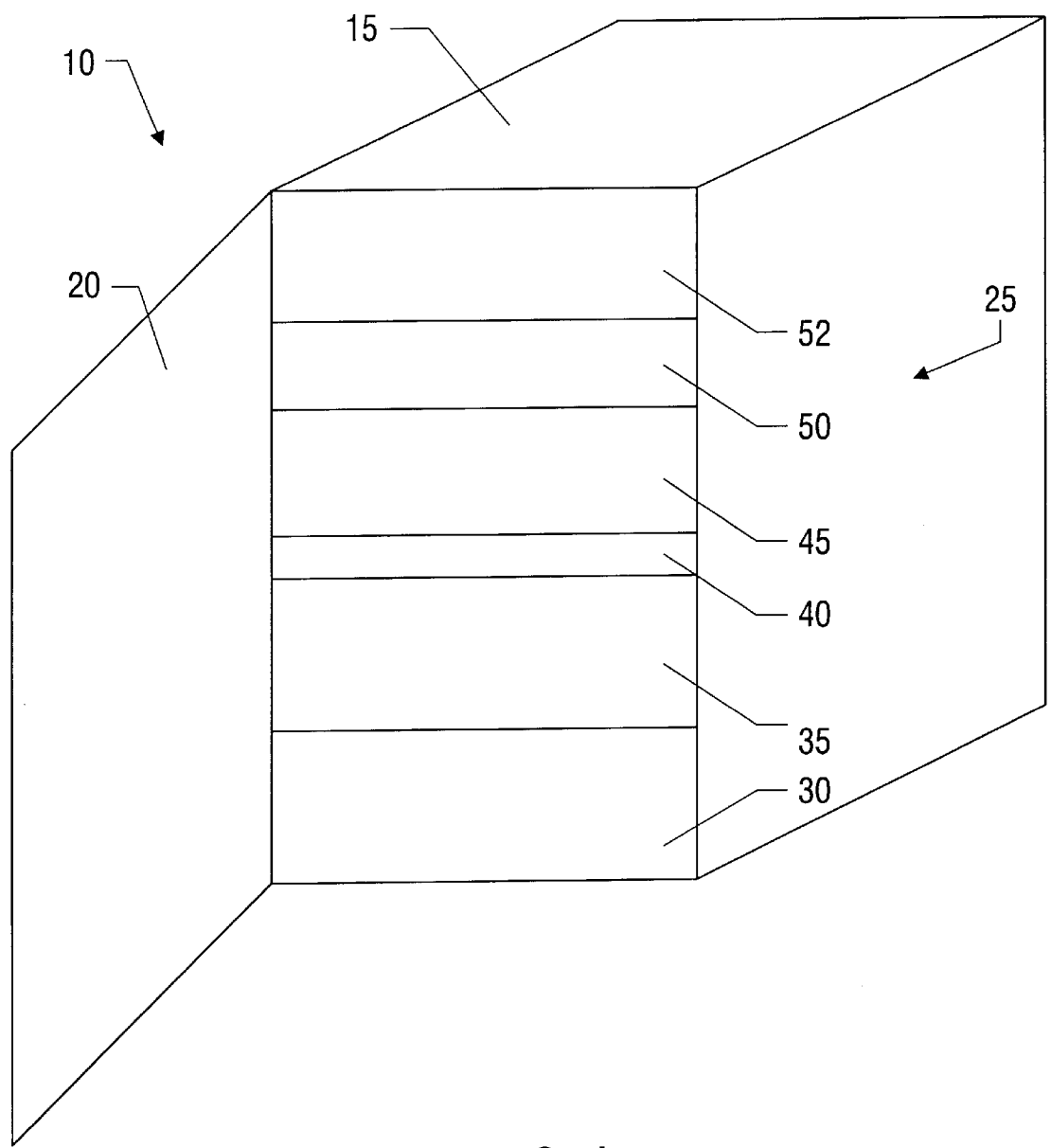
FIG. 1 is a simplified isometric view of a computer system in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now the figures, and particularly, to FIG. 1, a simplified isometric view of a computer system 10 is provided. The computer system 10 includes a cabinet 15 with a door 20 and a plurality of devices 25. The particular devices 25 employed in the computer system 10 depend on the specific application. These devices 25 may includes servers, storage devices, power management devices, or other equipment. Generally, the height of the devices 25 is measured in increments of 1.75", where 1.75" is referred to as 1 U. The total height capacity of the cabinet 15 may vary. Commonly available cabinets 15 have capacities of 22, 36 or 42 U, for example.

In the illustrated embodiment, two servers 30, 35, a keyboard assembly 40, a storage system 45 (i.e., having multiple hard disk drives), a pivotable display assembly 50, and a tape backup system 52 are installed in the cabinet 15. This mix of equipment is provided for illustrative purposes. It is contemplated that many other combinations may be used. The keyboard assembly 40 and pivotable display assembly 50 are described in greater detail herein.

Figure 2:
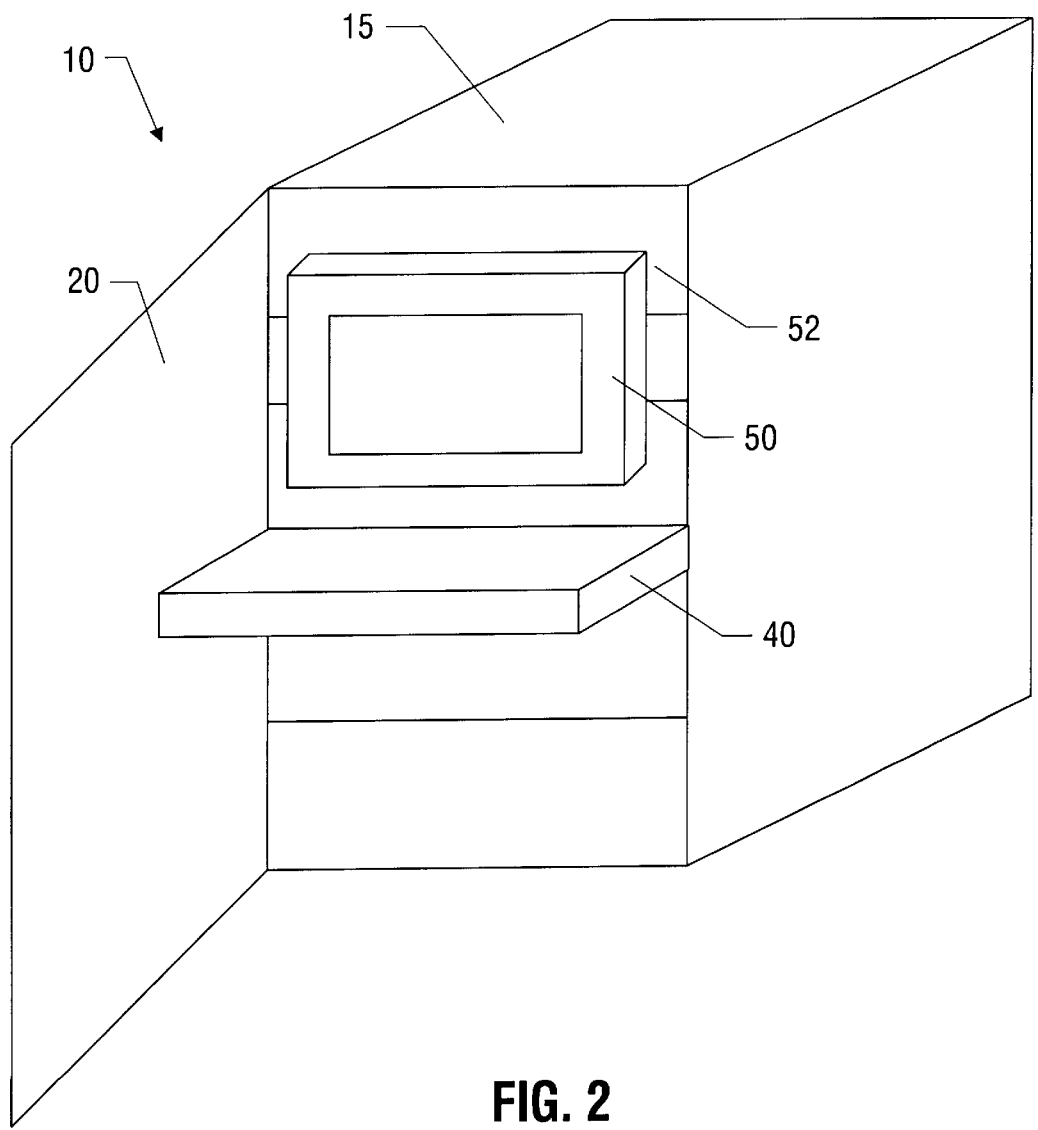
FIG. 2 is a simplified isometric view of the computer system shown with a keyboard assembly and a pivotable display assembly in their extended positions.

Turning now to FIG. 2, a simplified isometric view of the computer system 10 is shown with the keyboard assembly 40 and the pivotable display assembly 50 in their extended positions. The pivotable display assembly 50 is oriented such that sufficient clearance exists to allow the door 20 to be closed with the pivotable display assembly 50 in its extended position, albeit the keyboard assembly 40 must be inserted before the door 20 may be closed. The keyboard assembly 40 is discussed in greater detail in U.S. patent application Ser. No. 09/390,257, entitled, "METHOD AND APPARATUS FOR RETAINING AN ELECTRICAL CONNECTOR" in the name of Gary Landrum and Michael Owens, and incorporated herein by reference in its entirety.

Figure 3:
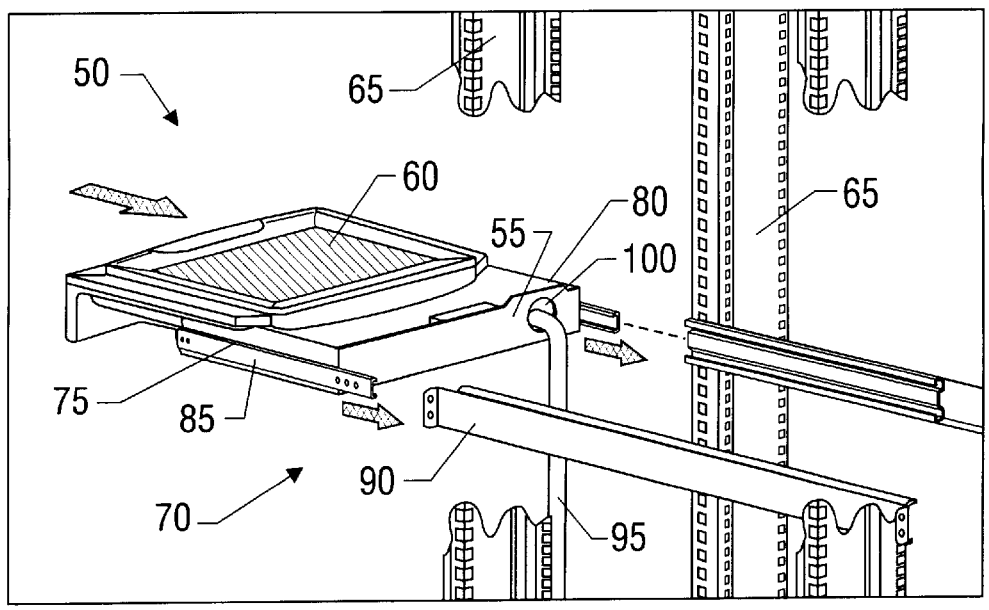
FIGS. 3 and 4 are isometric views of the pivotable display assembly and the cabinet of FIG. 2.
Figure 4:
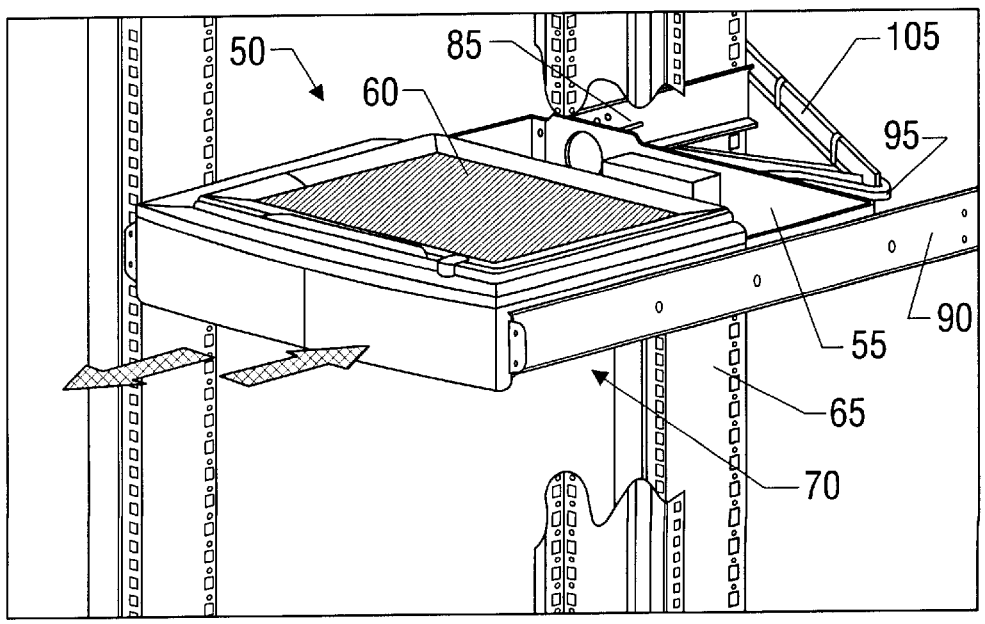

FIGS. 3 and 4 illustrate isometric views of the pivotable display assembly 50 and the cabinet 15 (shown in a cut away view). The pivotable display assembly 50 includes a tray 55 to which a display 60 (e.g., a flat panel display) is pivotably mounted. The cabinet 15 includes mounting rails 65 to which a pair of conventional slides 70 are disposed along opposite sides 75, 80 of the tray 55. The slides 70 generally include a moveable and fixed portion 85, 90. The fixed portions 90 are attached to mounting rails 65, while the moveable portions 85 are attached to the opposite sides 75, 80 of the tray 55. The moveable and fixed portions 85, 90 engage one another such that a sliding movement therebetween is provided. The slides 70 allow the tray 55 to translate linearly out of the cabinet 15 for easy access by a computer user, and into the cabinet 15 for storage.

A cable 95 coupled to the display 50 extends through a hole 100 defined in the tray 55. Typically, video signals are transmitted through the cable 95 to the display 50. A cable management arm 105 is provided to inhibit tangling of the cable 95 during lateral movement of the tray 55. Movement of the tray 55 necessarily produces similar movement of the pivotable display assembly 50.

Figure 5:
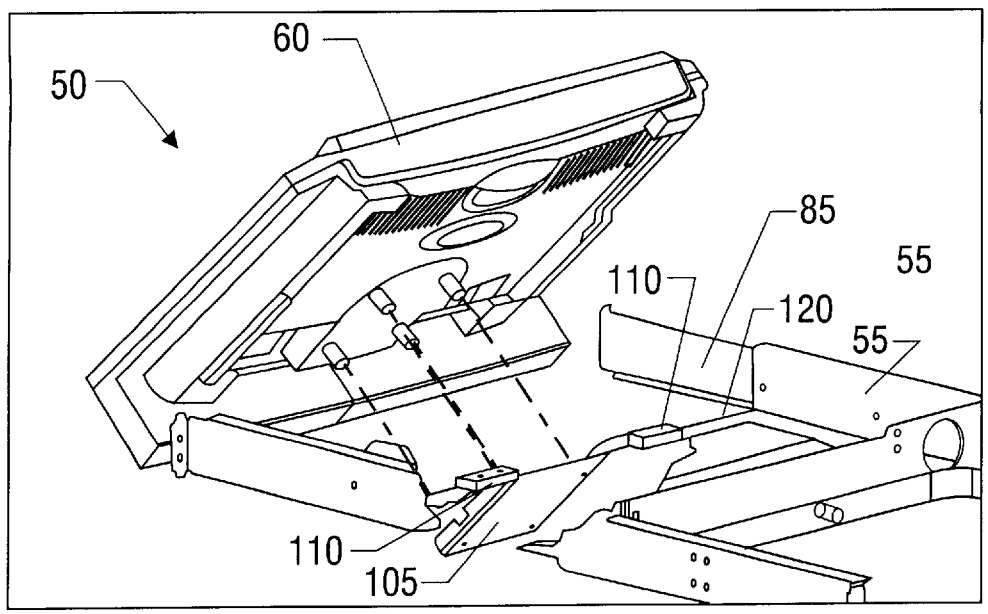
FIG. 5 is a rear isometric view of the pivotable display assembly with the display detached.

Turning now to FIG. 5, a rear isometric view of the pivotable display assembly 50 with the display 60 detached is shown. A back plate 105 is pivotably mounted to the tray 55 by hinges 110. The back plate 105 is in turn mounted (e.g., by screws or other suitable fasteners) to the display 60 proximate the front edge 120 of the tray 55. Accordingly, as the display 60 pivots, as shown in FIG. 6, it remains oriented proximate the front edge 120.

Figure 6:
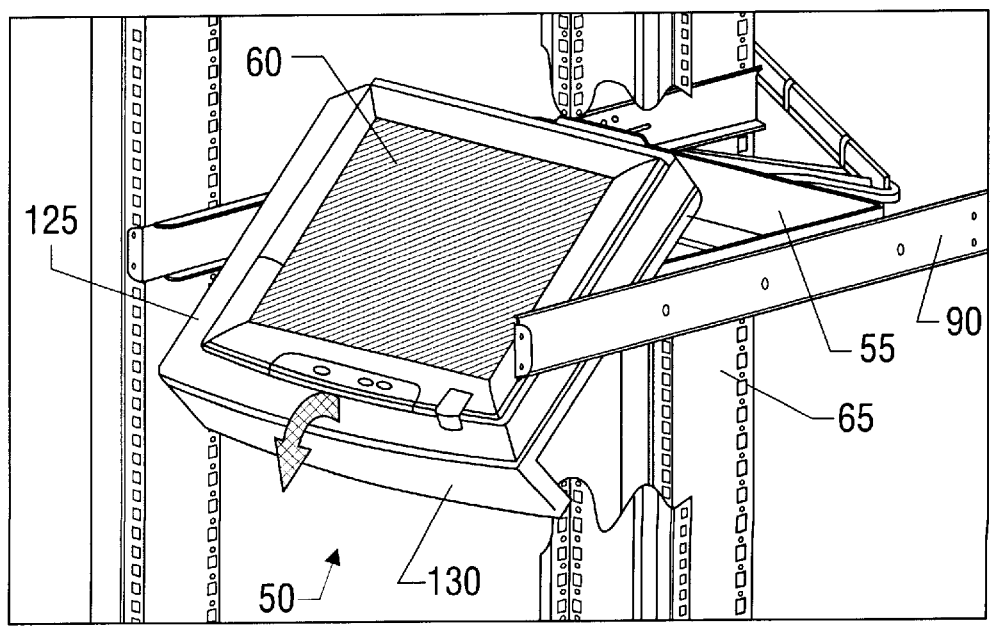
FIG. 6 is an isometric view of the pivotable display assembly with the display in a pivoted position.

As seen in FIG. 6, a bezel 125 is mounted to the display 60 for functional and aesthetic purposes. First, the bezel 125 provides physical protection to the display 60 to prevent damage from a user inadvertently bumping or striking the display 60. The end portion 130 of the bezel 125 obscures the tray 55, back plate 105, and electrical cords (not shown) when the pivotable display assembly 50 is in its stored position (as seen in FIG. 4) to provide a uniform, clean look.

Figure 7:
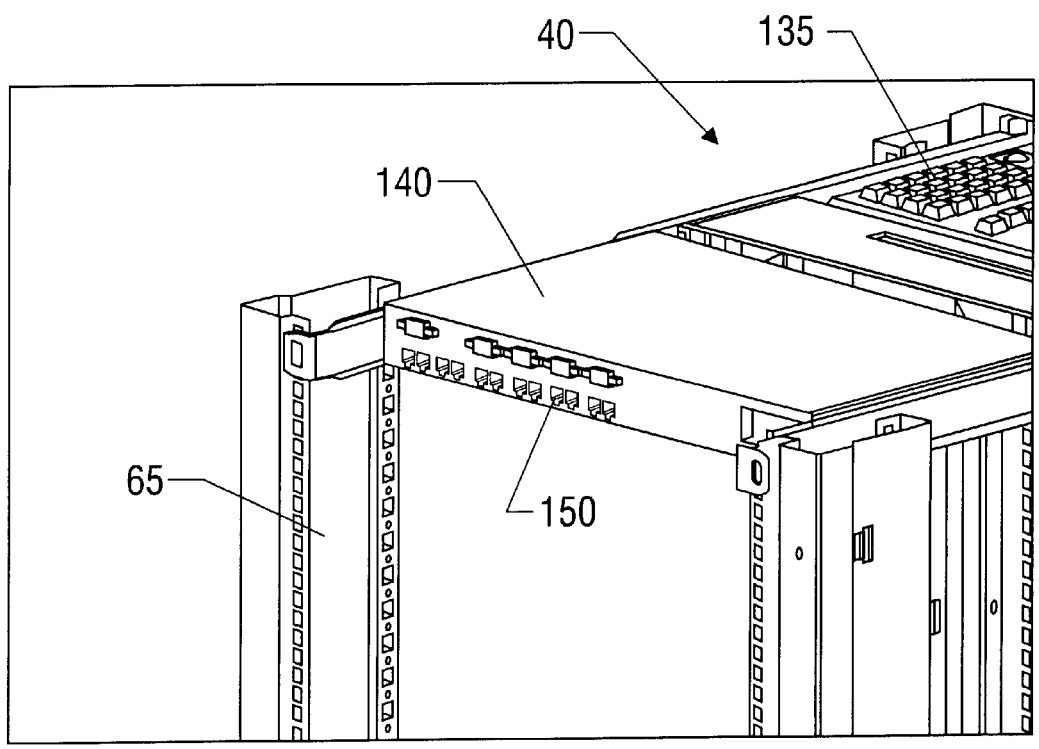
FIG. 7 is a cut-away isometric view of the computer system showing the keyboard assembly and a switchbox.

Turning now to FIG. 7, a cut-away isometric view of the computer system 10 showing the keyboard assembly 40 is provided. A keyboard 135 is contained in a keyboard tray 140 as described in the above-referenced U.S. patent application Ser. No. 09/390,257. A switchbox 140 is mounted to fixed mounting brackets 145. The fixed mounting brackets 145 also serve as fixed portions for slides (not shown) on the keyboard assembly 40. The switchbox is coupled to the keyboard 135 and the display 60 to route signals to a selected server 30, 35 through cables (not shown) connected to connectors 150 on the rear 150 of the switchbox 140. Coupling the switchbox 140 to the fixed mounting brackets 145 frees up space in the cabinet 15 for other components.

Figure 8:
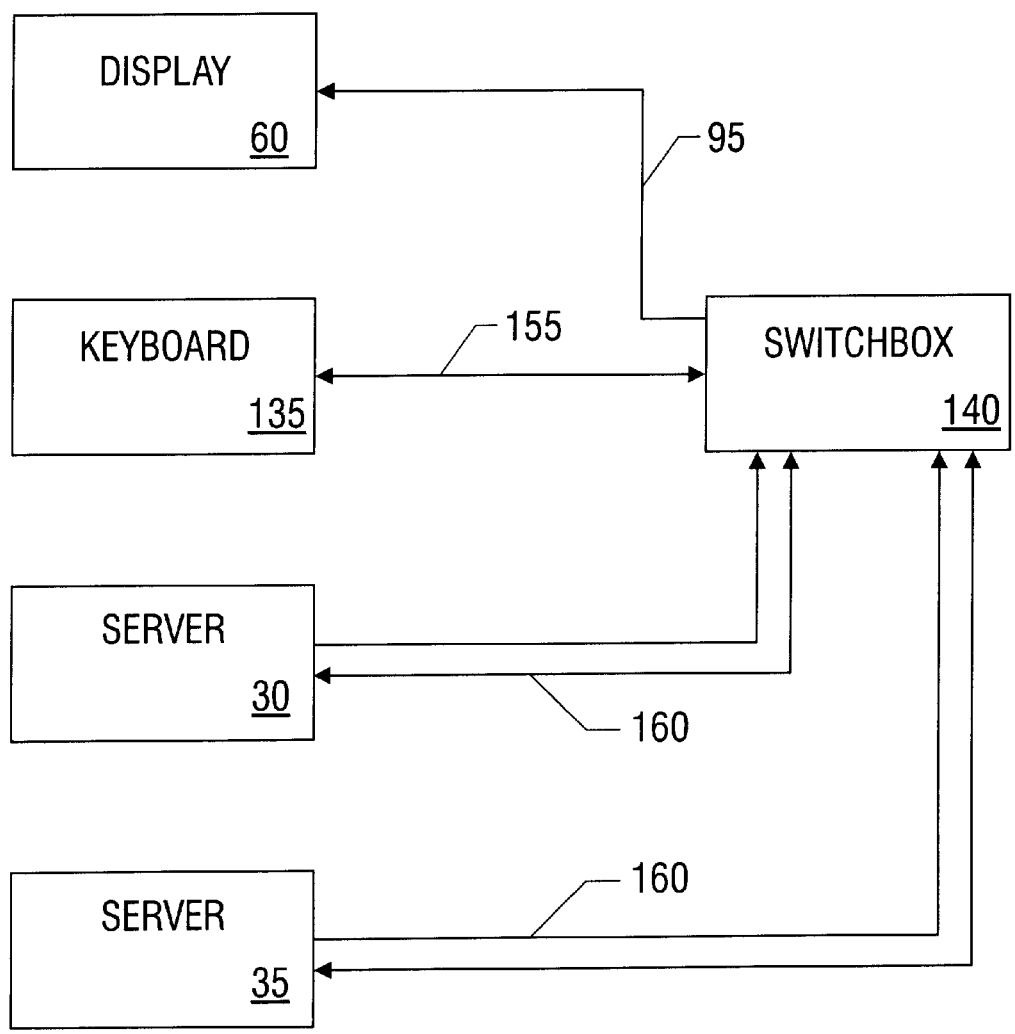
FIG. 8 is a simplified block diagram illustrating the interconnection between the keyboard, display, switchbox, and servers.

Referring to FIG. 8, a simplified block diagram illustrating the interconnection between the keyboard 135, display 60, switchbox 140, and servers 30, 35 is provided. The keyboard 135 and display 60 are coupled to the switchbox 140 by the display cable 95 and a keyboard cable 155. Server cables 160 are coupled to each of the servers 30, 35. The switchbox 140 selectively couples one of the server cables 160 to the display cable 95 and the keyboard cable 155 to allow the keyboard 135 to control the selected server 30, 35 and the display information from the server 30, 35 to be displayed on the display 60.

The mounting configurations of the keyboard assembly 40, pivotable display assembly 50, and switchbox 140 described herein provide numerous advantages. First, the proximity of the display 60 to the front edge 120 of the tray 55 of the pivotable display assembly 50 allows the display to be left in a viewable position without extending outwardly from the cabinet 15 or interfering with the door 20. Also, because the keyboard assembly 40 and the pivotable display assembly 50 are independently mounted to the cabinet 15, they may be oriented in any number of positions. This provides ergonomic advantages for the user of the computer system 10. Also, because the switchbox 140 is mounted in-line with the keyboard assembly 40, no additional space is required for the independent orientations. For example, if the keyboard 135 and display 60 were mounted in a common tray (not shown), the switchbox 140 would still have to be mounted in the cabinet, taking at least 1 U of space. Mounting the switchbox 140 is in-line with the keyboard assembly 40 allows independent positioning of the keyboard 135 and the display 60 without sacrificing additional space.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
   a cabinet, having mounting rails;
   a keyboard assembly, the keyboard assembly, including:
      a keyboard tray; and
      a keyboard slide having fixed and moveable portions, the fixed portion being mounted to the mounting rails, and the moveable portion being mounted to the keyboard tray; and
   a switchbox mounted to the fixed portion of the keyboard slide.

2. The apparatus of claim 1, further comprising a display mounted in the cabinet, wherein the display includes a display cable, the keyboard tray includes a keyboard having a keyboard cable, and the switchbox is coupled to the display cable and the keyboard cable.

3. The method of claim 1, further comprising:
   mounting a display in the cabinet, the display including a display cable;
   providing a keyboard in the keyboard tray, the keyboard having a keyboard cable; and coupling the display cable and the keyboard cable to the switchbox.

4. The apparatus of claim 2, further comprising a plurality of servers mounted in the cabinet, wherein the switchbox is adapted to couple a selected one of the servers to the display cable and the keyboard cable.

5. The apparatus of claim 2, wherein the keyboard assembly and the display assembly are mounted to the cabinet in different vertical positions.

6. The method of claim 3, further comprising:

mounting a plurality of servers in the cabinet; and selectively coupling a selected one of the servers to the display cable and the keyboard cable through the switchbox.

7. The method of claim 3, wherein mounting the keyboard assembly and mounting the display assembly include mounting the keyboard assembly and the display assembly to the cabinet in different vertical positions.

8. A method for assembling a computer system, comprising:

providing a cabinet, having mounting rails;

mounting a keyboard assembly to the mounting rails; and mounting a switchbox to the mounting rails in-line with the keyboard assembly.

9. The method of claim 8, wherein the keyboard assembly includes a keyboard tray and a keyboard slide having fixed and moveable portions, and the method further comprises mounting the fixed portion to the mounting rails and mounting the moveable portion to the keyboard tray.

10. The method of claim 8, wherein mounting the switchbox comprises mounting the switchbox to the fixed portion of the keyboard slide.

\* \* \* \* \*

UNITED STATES PATENT AND TRADEMARK OFFICE
CERTIFICATE OF CORRECTION

PATENT NO. : 6,185,092 B1
DATED : February 6, 2001
INVENTOR(S) : Gary Landrum et al.

It is certified that error appears in the above-identified patent and that said Letters Patent is hereby corrected as shown below:

Column 4,
Line 63, delete "1" and insert thereof -- 8 --.

Signed and Sealed this

Eleventh Day of December, 2001

*Attest:*

*Attesting Officer*

NICHOLAS P. GODICI
*Acting Director of the United States Patent and Trademark Office*